United States Patent
Walker et al.

[11] Patent Number: 5,674,039
[45] Date of Patent: Oct. 7, 1997

[54] SYSTEM FOR TRANSFERRING ARTICLES BETWEEN CONTROLLED ENVIRONMENTS

[75] Inventors: Delroy Walker, Springdale; Joseph Zihmer, Frederick; Danny Furches, Columbia; Christopher J. Garmer, Rockville, all of Md.

[73] Assignee: Fusion Systems Corporation, Rockville, Md.

[21] Appl. No.: 700,997

[22] Filed: Aug. 21, 1996

Related U.S. Application Data

[63] Continuation of Ser. No. 683,565, Jul. 12, 1996, abandoned.

[51] Int. Cl.⁶ ........................................... B65G 1/04
[52] U.S. Cl. .................. 414/222; 414/331; 414/411; 414/416; 414/786; 414/937; 414/939; 414/940
[58] Field of Search .................................. 414/217, 222, 414/331, 411, 416, 937, 939, 940, 786

[56] References Cited

U.S. PATENT DOCUMENTS

| | | | |
|---|---|---|---|
| 3,902,615 | 9/1975 | Levy et al. | 414/937 X |
| 4,427,332 | 1/1984 | Manriquez | 414/937 X |
| 4,532,970 | 8/1985 | Tullis et al. | 414/940 X |
| 4,534,389 | 8/1985 | Tullis | 414/940 X |
| 4,616,683 | 10/1986 | Tullis et al. | 414/217 X |
| 4,674,936 | 6/1987 | Bonora | 414/940 X |
| 4,674,939 | 6/1987 | Maney et al. | 414/940 X |
| 4,676,709 | 6/1987 | Bonora et al. | 414/940 X |
| 4,724,874 | 2/1988 | Parikh et al. | 414/940 X |
| 4,739,882 | 4/1988 | Parikh et al. | 414/940 X |
| 4,744,709 | 5/1988 | Hertel et al. | 414/937 X |
| 4,746,256 | 5/1988 | Boyle et al. | 414/940 X |
| 4,770,590 | 9/1988 | Hugues et al. | 414/937 X |
| 4,775,281 | 10/1988 | Prentakis | 414/937 X |
| 4,781,511 | 11/1988 | Harada et al. | 414/940 X |
| 4,802,809 | 2/1989 | Bonora et al. | 414/940 X |
| 4,815,912 | 3/1989 | Maney et al. | 414/940 X |
| 4,859,137 | 8/1989 | Bonora et al. | 414/648 |
| 4,895,486 | 1/1990 | Baker et al. | 414/939 X |
| 4,974,166 | 11/1990 | Maney et al. | 414/273 X |
| 4,995,430 | 2/1991 | Bonora et al. | 414/940 X |
| 5,097,421 | 3/1992 | Maney et al. | 364/468.2 |
| 5,166,884 | 11/1992 | Maney et al. | 364/468.2 |
| 5,169,272 | 12/1992 | Bonora et al. | 414/217 |
| 5,370,491 | 12/1994 | Bonora et al. | 414/217 |
| 5,372,471 | 12/1994 | Wu | 414/940 X |
| 5,378,107 | 1/1995 | Vierny et al. | 414/940 X |
| 5,431,600 | 7/1995 | Murata et al. | 414/411 X |
| 5,443,348 | 8/1995 | Biche et al. | 414/940 X |
| 5,469,963 | 11/1995 | Bonora et al. | 206/709 |
| 5,527,390 | 6/1996 | Ono et al. | 414/940 X |
| 5,562,383 | 10/1996 | Iwai et al. | 414/940 X |
| 5,588,789 | 12/1996 | Muka et al. | 414/940 X |

*Primary Examiner*—David A. Bucci
*Attorney, Agent, or Firm*—Pollock, Vande Sande & Priddy

[57] ABSTRACT

A SMIF system for transferring semiconductor wafers between two controlled environments, one being within a wafer cassette carrier and the other being within an enclosure around a wafer processing apparatus. In a carrier loading position, a carrier door rests on a port door which forms part of a platform for vertically fixing and horizontally moving the cassette within the enclosure. A carrier cover, when unlocked from the carrier door, is engageable by a port plate for vertical movement therewith as an elevator mechanism moves the port plate between down and up positions. In the down position, the port door closes an enclosure opening defined by the port plate. In the up position, the port plate raises the carrier cover to allow access to the wafers in the cassette by an article processing apparatus. External and internal panels carried by the port plate cause the controlled environment of the enclosure to be extended to include a compartment containing the uncovered cassette. The cassette platform also rotates to position the cassette relative to the article processing apparatus.

20 Claims, 11 Drawing Sheets

FIG_8

SYSTEM FOR TRANSFERRING ARTICLES BETWEEN CONTROLLED ENVIRONMENTS

RELATED APPLICATIONS

This is a continuation of U.S. application Ser. No. 08/683,565 filed Jul. 12, 1996, now abandoned, the entire contents of which are incorporated herein by reference.

FIELD OF THE INVENTION

The present invention relates to standard mechanical interface (SMIF) systems for transferring semiconductor wafers between controlled environments during the processing thereof for the manufacture of integrated circuits (IC's).

BACKGROUND OF THE INVENTION

In the manufacture of integrated circuits, a circular wafer of monocrystaline silicon is subjected to a series of processing steps, such as oxidation to form insulating layers of silicon dioxide, deposition of metallic layers, and masking and etching of the metallic layers to form conductive tracks, all as well known to those skilled in the art. A multitude of extremely small and complex integrated electrical circuits are thus formed on the semiconductor wafer. Due to the extremely small size of this circuitry, it only takes a very small size particle of contamination to cause either a short or open circuit. Such contamination can also prevent treatment chemicals from reaching some portions of the wafer during processing steps critical to circuitry formation. The potential sources of particulate contamination include personnel, handling equipment, treatment chemicals, moving air, and the wafers themselves.

Early efforts to overcome such contamination problems required processing the semiconductor wafers in clean rooms with filtered and recirculated air and suited personnel. Unfortunately, such clean room environments suffer from several disadvantages. Specially designed clean rooms are expensive to construct and maintain, and also quite inconvenient and expensive to operate because the personnel working in such rooms must always be fully suited. Furthermore, the clean room procedure is frequently not effective where the minimum feature size on the wafer is below one micron, as may now be encountered where dimensions have been reduced in the newer integrated circuit products.

A fairly recent innovation to overcome the disadvantages of clean rooms is the use of wafer cassettes in what are known as Standard Mechanical Interface (SMIF) systems. These systems are based on the principle that a relatively small volume of particulate-free air around each processing apparatus, with no internal source to generate particles, provides an improved contamination free environment for silicon wafer processing.

A SMIF system consists of two basic parts, namely a controlled clean mini-environment within a canopy or other enclosure surrounding the wafer-handling mechanism(s) of each processing apparatus, and a controlled clean environment within a wafer carrier or pod for transferring wafers from one processing apparatus to another. Each carrier may contain a cassette or other holder for holding a plurality of the semiconductor wafers. Thus, instead of maintaining a clean environment in an entire room in which personnel are also working, a clean mini-environment is maintained only within the processing machine and in the pod for carrying and transferring the wafers.

The cassette holding the wafers is transferred from the clean environment of the carrier into the clean environment of the processing machine through a port in the canopy of the processing machine. After the individual wafers are processed, they are placed back in the same or another cassette, and the reloaded cassette is then transferred back into the same or another carrier through the same or another canopy port.

One example of a conventional SMIF system is described in U.S. Pat. Nos. 4,532,970 and 4,616,683, the entire contents of which are expressly incorporated herein by reference. Conventional SMIF systems of this type have several disadvantages that result from the necessity of lowering the cassette from an upper carrier loading station outside of the canopy into a lower cassette unloading station within the canopy, as illustrated in FIG. 1. This arrangement often requires that the loading station be above the optimum ergonomic height for easy hand placement of the carrier into the loading station. Another disadvantage is that downward and upward movement of the cassette within the canopy may jostle the individual wafers, and thereby cause contaminating particles to be loosened and become airborne.

In addition, wafer cassettes are often indexed downward past a robot arm of fixed height so that the robot arm may remove individual cassettes for processing. The friction between the wafer and the cassette structure may create airborne contaminating particles as the wafers are loaded and unloaded. As the cassette is then moved downward or upward after removal or reinsertion of a particular wafer, the next wafer must pass through the airborne contamination created by the handling of the previous wafer.

SUMMARY OF THE INVENTION

A principal object of the present invention is to overcome the foregoing disadvantages of the prior art, and to prevent contamination of sensitive articles with particulates, by avoiding vertical movement of articles while stacked within an article holder.

Another object of the invention is to extend a second controlled mini-environment to incorporate a first controlled mini-environment to reduce the amount of movement required for processing an article within a controlled environment.

A further object of the invention is to provide a SMIF system providing fixed vertical placement at an ergonomic height of a wafer holder and only horizontal movement of the wafer holder within a controlled environment.

Another object of the invention is to provide vertically indexed manipulating means for removing articles from and placing articles in a vertically fixed article holder.

It is also an object of the invention to provide a method and apparatus for transferring semiconductor wafers from a SMIF carrier to a wafer processing station without contaminating a controlled mini-environment at the processing station.

It is a further object of the invention to provide for the use of a SMIF carrier with processing equipment in an enclosure having a controlled mini-environment, and to provide a method and apparatus for controlling the interaction between the SMIF carrier and the processing equipment.

It is another object of the invention to provide a transfer system for semiconductor wafers in which vertical placement of the wafer holder is fixed, and in which horizontal movement and orientation of the wafer holder is controlled to facilitate wafer transfer within the mini-environment of wafer processing equipment.

A still further object of the invention is to provide a semiconductor wafer handling system in which the potential of subjecting the wafers to shock and vibration is substantially reduced by fixed vertical placement of the wafer holder.

The advantages of the present invention over prior art SMIF systems include the following. It allows loading of the wafer carrier (pod assembly) on the processing tool enclosure (canopy) at the standard ergonomic position. As the wafers are loaded and unloaded, they are never placed in the same air space as the carrier door, the port door, or the preceding wafer because the wafer manipulating robot does all of the vertical indexing while the article holder remains vertically fixed. The invention uses a highly reliable wafer detection system for indexing the wafer engaging member of the robot. It provides a modularity that is easy to disassemble and thereby improves the serviceability of the transfer system. It allows many process tools to use their usual wafer transfer and handling methods. It is adaptable to many existing process tools with significantly less-modifications than required for other SMIF system designs. The wafer holder (cassette) is not indexed vertically, but instead remains undisturbed during opening of the wafer carrier, which is achieved by vertical travel of only the port plate and the carrier cover.

The invention also provides improved alignment of the wafer engaging member of the robot with the wafer cassette, which is readily positioned in proper alignment by a horizontally movable and rotatable transport platform. A variety of wafer handling configurations are possible because the port door of the processing tool is mounted on the transport platform, and the carrier door and the cassette already rest on the port door when the carrier door is unlocked and the carrier cover is vertically displaced. The use of transparent anti-static plastic panels in parts of the enclosure defining the transfer compartment adjacent to the processing tool compartment allows visual inspection of wafer manipulation during transfer and processing operations. Although the specific embodiment described below is for dual cassette operation, the invention is easily adaptable to single cassette operation as will be apparent to those skilled in the art.

These and other objects and advantages are achieved by the present invention which provides a method and apparatus for transferring articles, such as semiconductor wafers, between two controlled environments. The first controlled environment is defined by an article carrier having a cover and a door for sealing an opening in the bottom of the cover. The second controlled environment is defined by an enclosure or canopy around equipment for processing the article. The article carrier includes holder means for supporting at least one article, preferably a plurality of articles, on the bottom door of the carrier.

An opening in the enclosure is defined by a port plate serving as a vertically movable port frame, and a port door is provided for closing this opening. The port door is fixed to a transport platform for supporting the port door, the carrier door, and the article holder at a fixed vertical height within the enclosure. The carrier cover is engageable by the port plate for movement therewith, and lift means is provided for moving the port plate between a down position and an up position. In the down position of the port plate, the port door closes the enclosure opening. In the up position of the port plate, the carrier cover is raised to allow access to the article holder by an article processing apparatus while the article holder rests on the carrier door, which in turn rests on the port door that forms part of the supporting platform.

The lift means for moving the port plate between its down and up positions may comprise a vertically extending guide rail on three sides of a ball nut assembly driven by a ball screw, means for connecting the nut assembly to the port plate, and drive means for rotating the screw to move the ball nut assembly along the vertical guide rail.

With the carrier cover raised, no movement of the supporting platform may be needed for the articles in the holder to be reached and engaged by an article engaging means of the processing tool. However, the transfer system of the invention preferably includes transport means for moving the transport platform horizontally so as to move the holder from its initial uncovered position to an article processing position at which individual articles are removed for processing within the enclosure. This transport means is arranged to move the platform between the retracted uncovering position with the holder uncovered beneath the carrier cover to an extended article processing position in which the article may be engaged by the manipulating means of an article processing apparatus.

The transport means preferably comprises both translation means for causing translational movement of the platform to and from the area of a processing apparatus, and rotation means for causing rotational movement of the platform to orient the article holder relative to the processing apparatus. This is particularly desirable where, after entry into the controlled environment of the enclosure, the article holder needs to be moved into the vicinity of the processing apparatus and then rotated into a position that is indexed for alignment with the article engaging means of the processing apparatus.

The translation means preferably comprises a curved or linear track, a carriage engaged with the track for movement therealong, and drive means for pulling and pushing the carriage along the track. The rotation means may comprise various mounting means for rotatably mounting the platform on the carriage and torque means for causing rotation of the platform relative to the carriage. The preferred rotation means comprises a carriage stop at the inner end of the track, a laterally offset rod for imparting a torque to the rotatably mounted platform, and a return spring for returning the platform to its in-line position when the carriage is away from the stop. Both translational and rotational movements may also be accomplished by other types of linear and rotational actuators, such as electronic type actuators.

Where multiple articles are transported within the holder and each article is to be handled at the processing station, the article engaging means of the processing apparatus is indexed vertically relative to the article holder so as to successively engage articles held at different levels within the holder. Both the platform and the holder are maintained in a fixed vertical position, which eliminates the jostling and jarring to which the holder might otherwise be subjected. Such jostling and jarring can create undesired particulate contamination due to friction between the articles and the holder structure.

In the preferred embodiment described in the Detailed Description below, the specific article being transported and transferred is described by way of example as a semiconductor wafer that is being processed for the manufacture of an integrated circuit chip. The article holder specifically described by way of example is a cassette for supporting a plurality of semiconductor wafers on the bottom door of the wafer carrier. However, it is contemplated that both the method and apparatus of the invention may be used for the transport, transfer and processing of a wide variety of articles of other types.

BRIEF DESCRIPTION OF THE DRAWINGS

A more complete understanding of the invention may be obtained by considering the Detailed Description below in conjunction with the accompanying drawings, in which.

DETAILED DESCRIPTION OF THE INVENTION

The preferred embodiment of the present invention will be described in the context of a SMIF system for transferring semiconductor wafers between a portable carrier and the enclosure or canopy of a wafer processing apparatus. However, it is contemplated that the transfer system of the invention may be used to transfer other articles, particularly articles requiring transfer from one controlled environment to another.

The general structure of a conventional SMIF cassette carrier or "pod", and the mating of a SMIF pod with the enclosure or "canopy" of wafer processing equipment, are described in U.S. Pat. Nos. 4,674,939, 4,815,912 and 4,995, 430, all assigned on their face to Asyst Technologies, Inc., of Milpitas, Calif. The entire contents of each these patents is expressly incorporated herein by reference.

Figure 1:
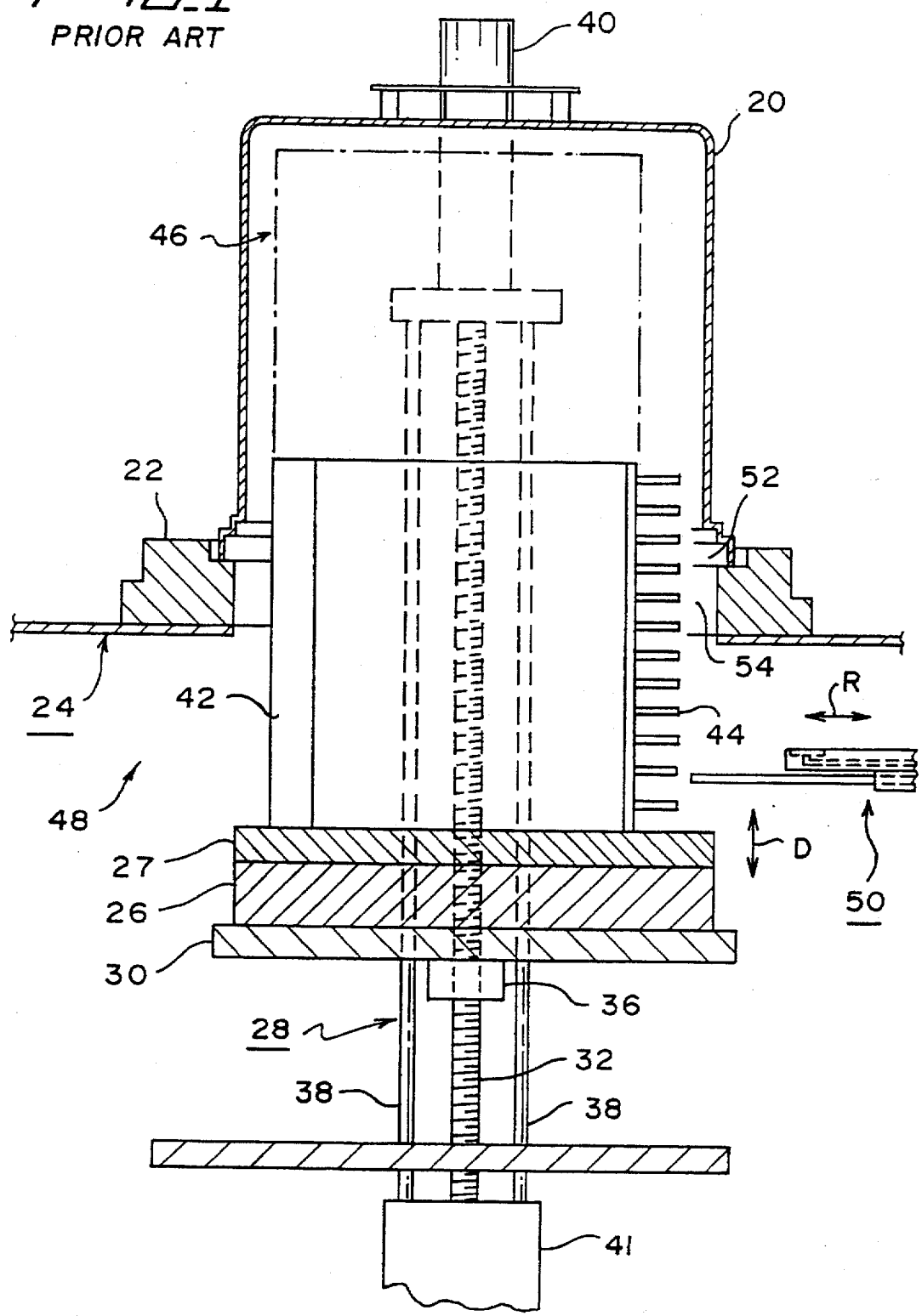
FIG. 1 is a diagrammatic elevational view in section illustrating a prior art SMIF cassette transfer station.

FIG. 1 illustrates the mating of a SMIF pod 20 with a port plate 22 fixedly mounted in a wall of canopy 24. In addition to port plate 22, the port assembly includes a port door 26 and an elevator mechanism, generally designated 28. The elevator mechanism 28 includes a ball screw 32, a traveler 36 for engaging and traveling along screw 32, a drive motor 40 for rotating screw 32, guide rods 38, 38 for guiding and preventing rotation of traveler 36, a support column 41 for anchoring the guide rods and housing a bearing assembly (not shown) for rotatably supporting screw 32, and a lift platform 30 carried by traveler 36. The threaded engagement between the ball screw 32 and the traveler 36 drives the lift platform 30 up or down within the canopy 24 in the direction of double ended arrow D, depending on the direction of screw rotation by reversible motor 40.

The elevator mechanism 28 transports a cassette 42 for holding individual semiconductor wafers 44, which may be manipulated within the canopy 24 by a processing apparatus designed to perform one or more steps for converting the wafers into integrated circuits. The elevator mechanism 28 lowers the cassette 42 from its broken line position within the interior region 46 of the pod 20 into the region 48 beneath the canopy 24. As the cassette 42 is lowered in indexed increments past a robot arm 50, which is maintained at a fixed height, the robot arm is extended and retracted in the direction of double ended arrow R to engage and remove an individual wafer 44 for processing, and then to return the processed wafer to the cassette.

A disadvantage of this arrangement is that the removal and return of each wafer relative to the cassette structure may produce airborne contamination, into which the next sequential wafer is then lowered so as to be in position to be picked up by the robot arm 50. After all of the individual wafers have been removed from the cassette 42, processed by the processing apparatus within the canopy 24, and returned to the cassette 42, the platform 30 is driven upward to a carrier closing position, at which the pod door 27 closes the pod opening 52 and the port door 26 closes the port opening 54 in the canopy 24. Thereafter, the pod 20, containing the processed wafers 44 as held within cassette 42, may be picked up manually and removed from the port plate 22 for transport to another wafer processing station.

Figure 2:
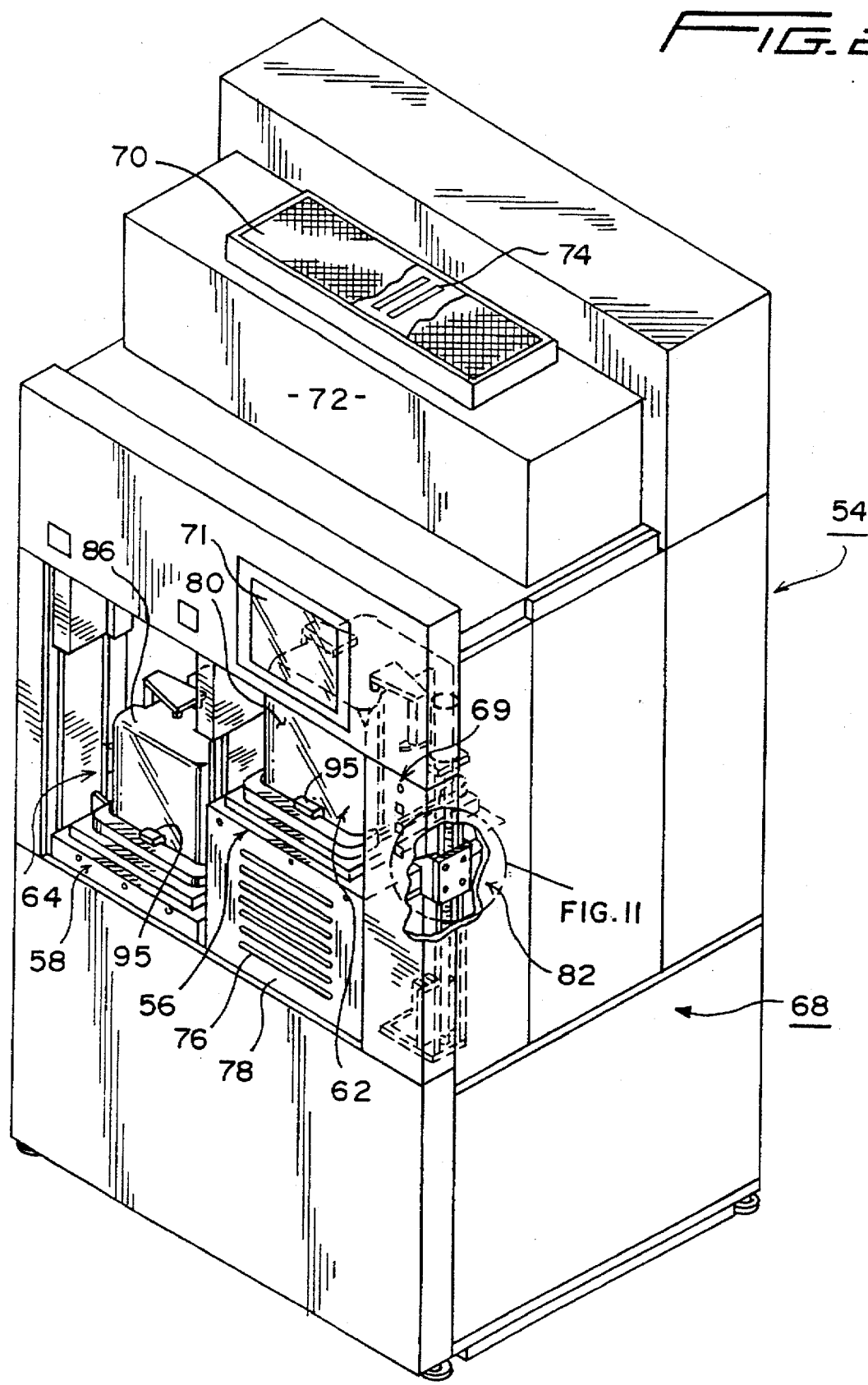
FIG. 2 is a perspective front view of the transfer system of the invention showing dual transfer stations, the left station being in the cassette carrier loading position and the right station being in the cassette uncovering position with the carrier cover in its raised position.

FIG. 2 illustrates a processing apparatus 54 made in accordance with the invention and having dual wafer handling stations 56 and 58 for simultaneously handling two identical cassette carriers 62 and 64, each carrying a plurality of wafers 44 held in wafer holders or cassettes 66 and 67. Apparatus 54 also includes a cabinet, generally designated 68, which serves as a canopy for enclosing a controlled mini-environment within the apparatus 54. For providing this mini-environment, a pre-filter 70 with air inlet louvers 74 and a blower and primary filter unit 72 may be mounted on the top of cabinet 68. On the front of cabinet 68 there may be located a panel of switches 69 for activating the various servomotors associated with the cassette transfer stations 56 and 58 as described below, and a CRT monitor 71 for monitoring the corresponding operations within the cabinet 68. As will also be explained in more detail below, the clean air provided by blower and primary filter unit 72 and pre-filter 70 exits the cabinet 68 via louvers 76 in a movable front panel 78.

In FIG. 2, a front view, and in FIG. 3, a rear view, the left handling station 58 is in the carrier loading position, and the right handling station 56 is in the cassette uncovering position in which the carrier cover 80 has been raised above the wafer cassette 66 by an elevator mechanism 82 as will be described further below. A second elevator mechanism 84 is positioned to raise the cover 86 of the second carrier 64. The cover 80 has a pair of handles 88, 88 and the cover 86 has a pair of handles 89, 89. As the internal and external elements and components of each of the handling stations 56 and 58 are substantially the same, only station 56 will be described in specific detail.

Figure 4:
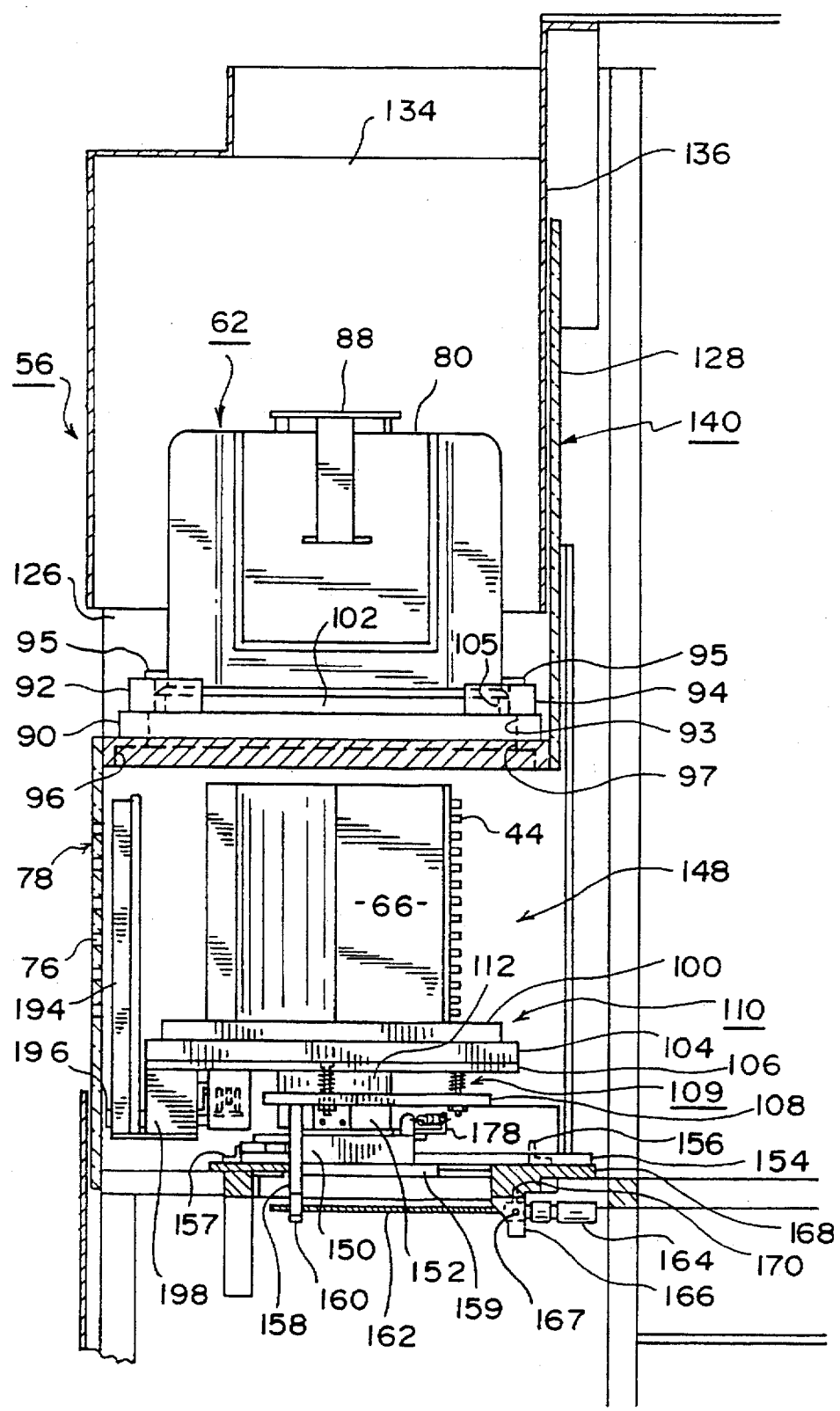
FIG. 4 is a right side fragmentary elevational view in section showing the right transfer station of FIG. 2.

Referring now to FIG. 4, there is shown in side elevation the handling station 56 wherein the carrier cover 80 has been raised above the cassette 66 so that the individual wafers 44 held within the cassette may be processed within the mini-environment of the processing apparatus 54. The carrier cover 80 is supported on a port plate 90, on which it is held in proper alignment by a front alignment block 92 and a rear alignment block 94. Preferably, cover 80 is detachably secured to the port plate 90 by clamping mechanisms 95, 95 prior to vertical movement of the port plate.

The port plate 90 and the carrier cover 80 are moved vertically by a lift plate 96 which is raised and lowered by the elevator 82 to which it is connected by a pair of arms 122, 122 extending from a U-shaped bracket 98 carried by a screw follower 120, such as a ball nut assembly. When the cover 80 is its lowered position, i.e., the same position as shown for cover 86 in FIGS. 2, 3 and 6, a carrier door 100 seals a corresponding opening 105 in a carrier base 102 of the carrier cover 80, and a port door 104 fits snugly within a corresponding opening 93 of the port plate 90 after passing through a central opening 97 in the lift plate 96. Port door 104 preferably utilizes an air seal between it and the port plate to maintain the integrity of the mini-environment. However, mechanical seals also may be used.

When the carrier door 100 is in its closed position within carrier base 102, it may be unlocked from or locked and sealed to the carrier base 102 by conventional locking and sealing mechanisms, portions of which may be housed within carrier base 102, carrier door 100 and port door 104, such as shown and described in U.S. Pat. Nos. 4,674,939, 4,815,912 and 4,995,430. The entire contents of these patents are expressly incorporated herein by reference. These patents are assigned to Asyst Technologies, Inc., of Milpitas, Calif., and the corresponding equipment is also available from this source. Actuating means (not shown) for remotely actuating the clamping mechanisms 95, 95 is also available from this source, and this actuating means may be housed within the alignment blocks 92 and 94.

In prior art configurations, the port door, on which rest a carrier door and a cassette, is lowered into a position from which the cassette may be removed as shown in the above referenced patents. In the present invention, the port door 104 is fixedly secured to an upper plate 106 of a cassette platform assembly 110. Extending through a central aperture in upper plate 106 is a motor housing 112 which contains a remotely actuatable motor and related mechanisms (not shown) for operating the carrier door locking mechanism and the cover clamping mechanisms referred to above. The platform assembly 110 also comprises a lower plate 108 supporting upper plate 106 by three or more, preferably three (3), connecting pillars 109, each of which comprises a stiff coil spring 111 around a central securing bolt 113 that has a securing nut 117 under the lower plate. While the head 119 of bolt 113 is fixed within a counterbore in the upper plate 106 (FIG. 8), the lower portion of the bolt is free to pass through an aperture in lower plate 108 such that adjustment of the nut 117 along the threaded portion of the bolt provides for adjustment of the tilt of the upper plate relative to the lower plate when needed for alignment of the wafers with the path of a robot arm.

The vertical movement of lift plate 96 is provided by the elevator mechanism 82, which comprises a reversible electric servomotor 115 for rotating a lift screw 118 to cause the raising and lowering of the screw follower 120 on which is mounted the lift plate 96 by the U-shaped bracket 98 having arms 122, 122. The screw 118 is preferably of the ball or ACME type, and follower 120 is preferably a ball or ACME nut assembly. Follower 120 is guided, and its rotation is prevented, by means of a U-shaped linear rail 124, which is mounted on base plate 168 by a foot member 101 having two triangular posts 103, 103. As seen best in FIG. 5, the arms of rail 124 extend outward and the arms of bracket 98 extend inward.

Figure 10:
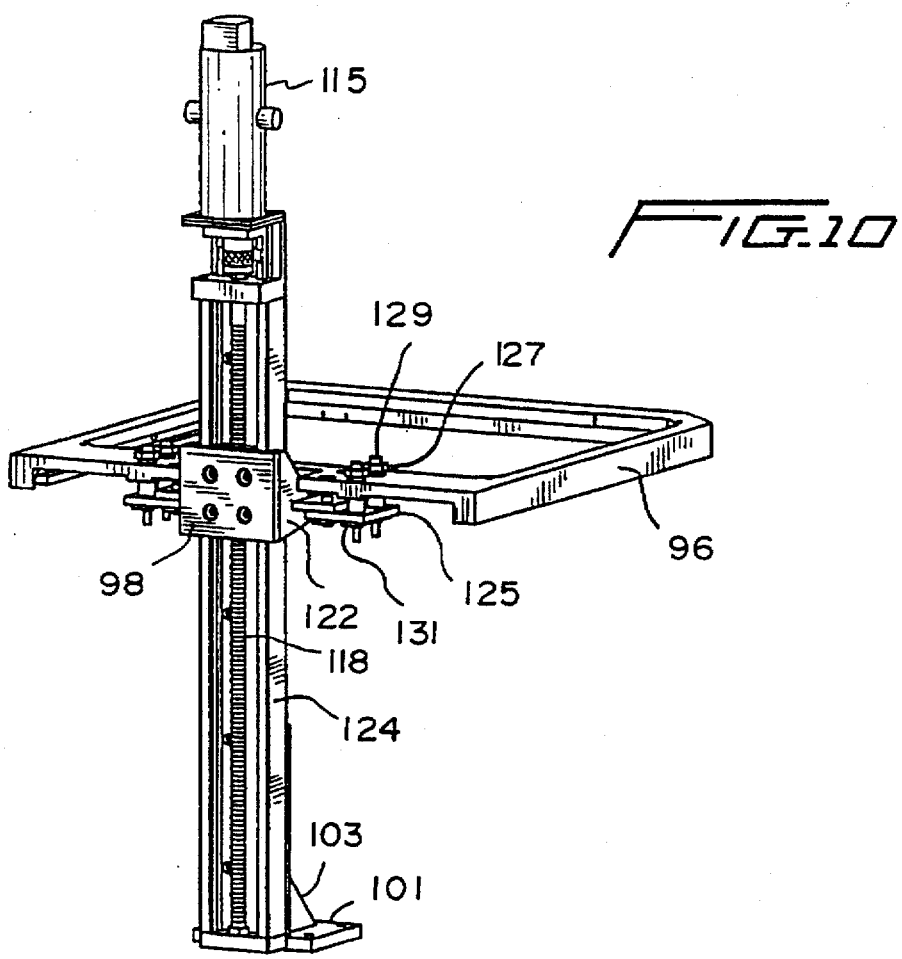
FIG. 10 is a perspective view in elevation showing details of the elevator mechanism for raising and lowering the port plate.
Figure 11:
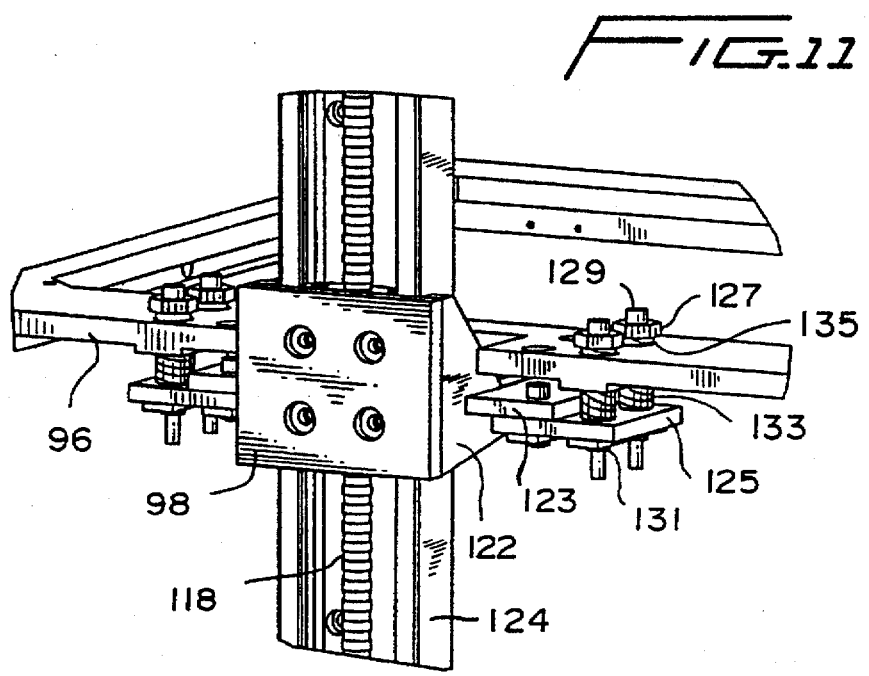
FIG. 11 is a perspective elevational view showing the elevator details identified by the circular broken line in FIG. 2; and, FIG. 12 is a diagrammatic front perspective view illustrating air flow between internal compartments of the enclosure containing the cassette transport components and the wafer processing apparatus.

The details of the elevator mechanism 82 are shown in FIG. 10, and the details of the attachment means for securing lift plate 96 to elevator mechanism 82 are shown in FIG. 11. Mounted laterally on each of the arms 122, 122 of bracket 98 is a flange 123 to which is bolted an anchor plate 125 supporting two adjustor nuts 127 each locked in position by a corresponding locking screw 129, which passes through a central bore of the adjustor nut and engages a locking nut 131 under anchor plate 125. Adjustor nuts 127 each have a threaded shank 133 which engages corresponding threads in an adjustor nut aperture 135 in lift plate 96. Thus, adjustor nuts 127 may be rotated to adjust the tilt of lift plate 96 and then locked in a fixed position by the tightening of locking screws 129 relative to locking nuts 131.

The components of the platform assembly of the left station 58 are substantially identical to the corresponding components of the platform assembly 110 of the right transfer station 56 so that the same numerical reference characters are used in the drawings to identify the same components of both of these platform assemblies. Similarly, the components of the left elevator mechanism 84 are substantially identical to the corresponding components of the right elevator mechanism 82 so that the same numerical reference characters also are used in the drawings to identify the same components of both of these elevator mechanisms.

In order to maintain the integrity of the mini-environment within cabinet 68 as the carrier cover is raised, a plurality of panels are mounted on the lift plate 96 for movement therewith, and these moving panels cooperate with fixed panels secured to the frame of cabinet 68 to form air seals capable of maintaining a positive air pressure within cabinet 68 greater than the pressure of ambient air external to the cabinet. These air seals are in the form of relatively narrow gaps of substantial length through which only relatively small quantities of air may pass from the inside to the outside of the cabinet and thereby exclude the entry of external air.

Three upstanding panels 126, 128 and 130 are provided on the left, rear and right sides, respectively, of lift plate 96 so as to form vertical walls opposite the corresponding sides and rear of carrier cover 80. Moving panels 126, 128 and 130 cooperate with fixed cabinet panels 134, 136 and 138, respectively, as may be seen best in FIGS. 3, 6 and 12. The moving panels 126, 128 and 130 form a wraparound rear door 140 for opening and closing a rear portal 142 through which a cassette 66 on the cassette platform 110 may travel or otherwise be made accessible to wafer engaging elements of a robot 144 for unloading and reloading the wafers 44.

Figure 3:
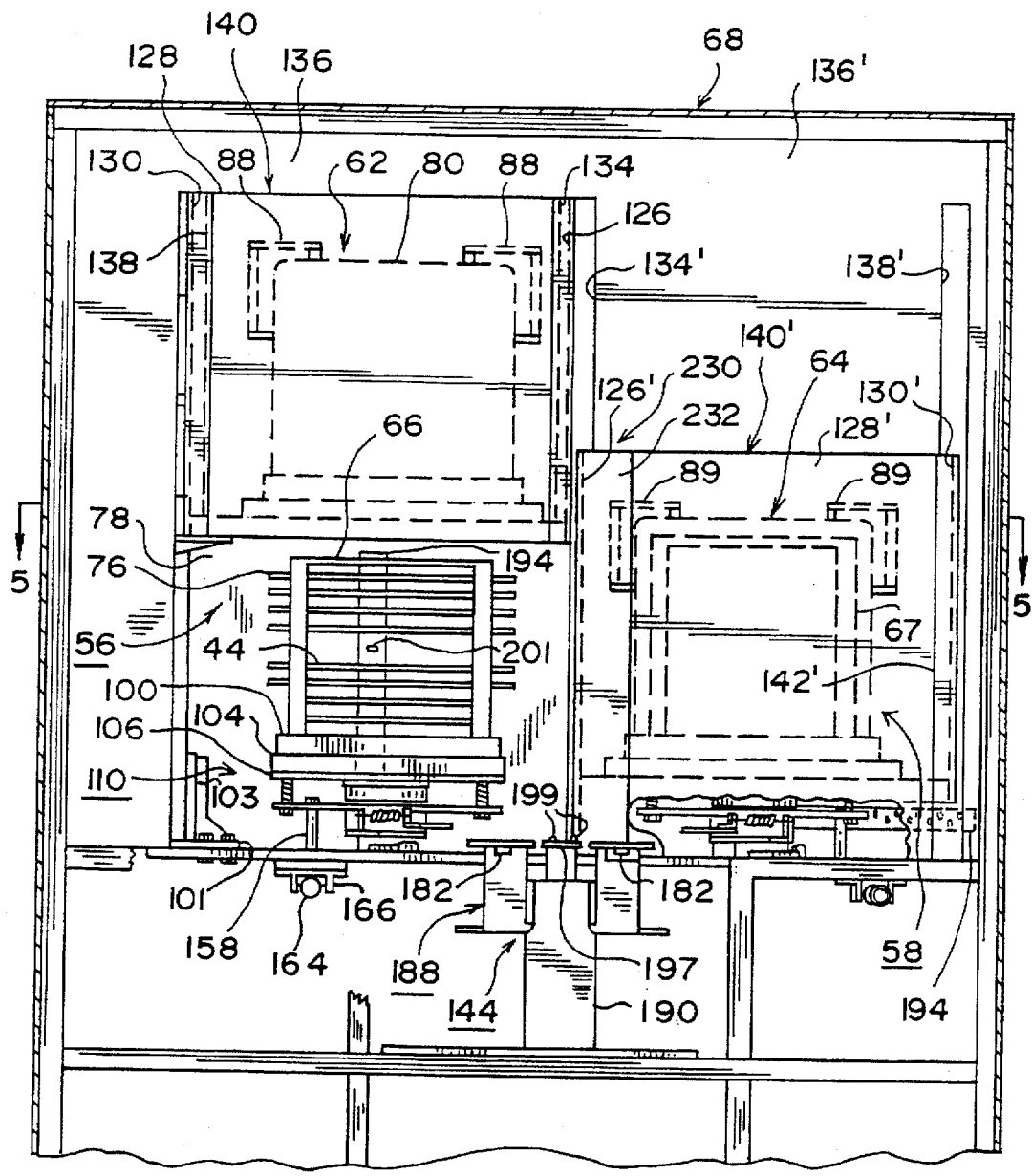
FIG. 3 is a rear elevational view of the transfer system of the invention in which both cassette platforms are in their retracted positions, and the cassettes, the carrier components and the platforms are in the same position as shown in FIG. 2.
Figure 6:
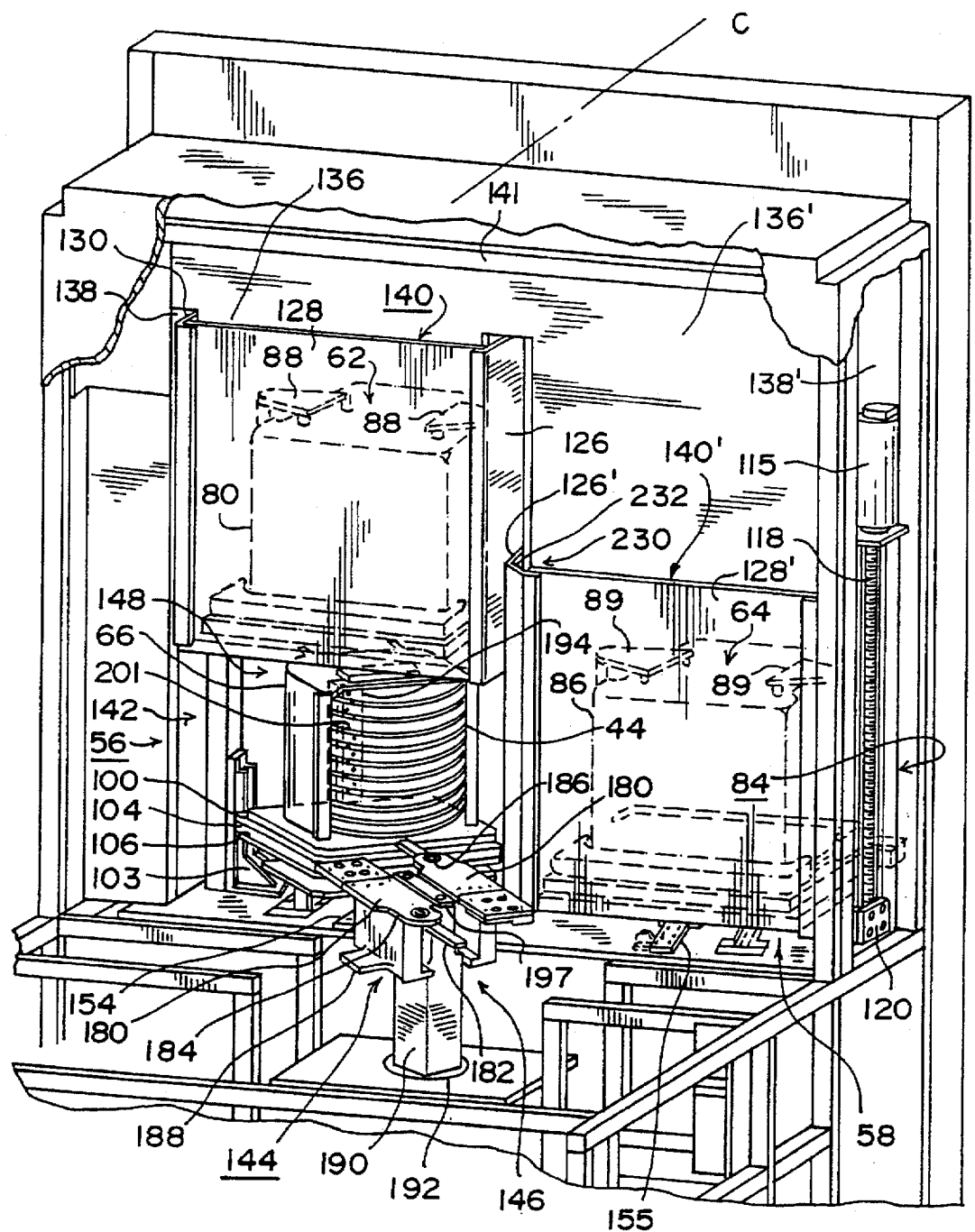
FIG. 6 is a perspective fragmentary rear view similar to FIG. 3, but with the right cassette platform in its extended position for wafer processing and the left cassette platform in its retracted position.

As shown in FIGS. 3 and 6, the second transfer station 58 has a wraparound rear door 140' for opening and closing a rear portal 142'. Door 140' has moving panels 126', 128' and 130' that cooperate with fixed cabinet panels 134', 136' and 138', and operates in the same manner as rear door 140 of transfer station 56. The moving panels of rear doors 140 and 140' travel up and down outside of the corresponding fixed panels, which are depending panels suspended from an overhead frame member 141 of cabinet 68.

Also mounted on the front of lift platform 96 is a depending lower panel forming the front panel 78 having louvers 76. The lower front panel 78 and the upper rear panel 128 are preferably made of transparent plastic, such as anti-static PLEXIGLASS or some other acrylic type plastic, to permit visual inspection of the operations taking place within the cabinet 68, and to facilitate maintenance of the equipment within the mini-environment of this enclosure.

When the station 56 is in its loading position for placement of the carrier 62 therein, the lift plate 96 is in its lowermost position, at which time the rear access portal 142 is completely closed by the rear door 140 to prevent any substantial flow of air from the mini-environment of the wafer processing area 146 in which the robot 144 is located. As the lift plate 96 is raised by the elevator 82 from its lowermost position to its uppermost position shown in FIG. 4, the rear door 140 is raised to open the access portal 142 and the louvered front panel 78 is raised to create a new enclosure around the cassette 66 as the carry cover 80 is also being raised. Thus, the effect of raising rear door 140 and front panel 78, which cooperate with fixed side walls of the transfer station 56 to form the new cassette enclosure, is to extend the mini-environment of the processing area 146 to include the platform area 148 surrounding the uncovered cassette 66.

Figure 12:
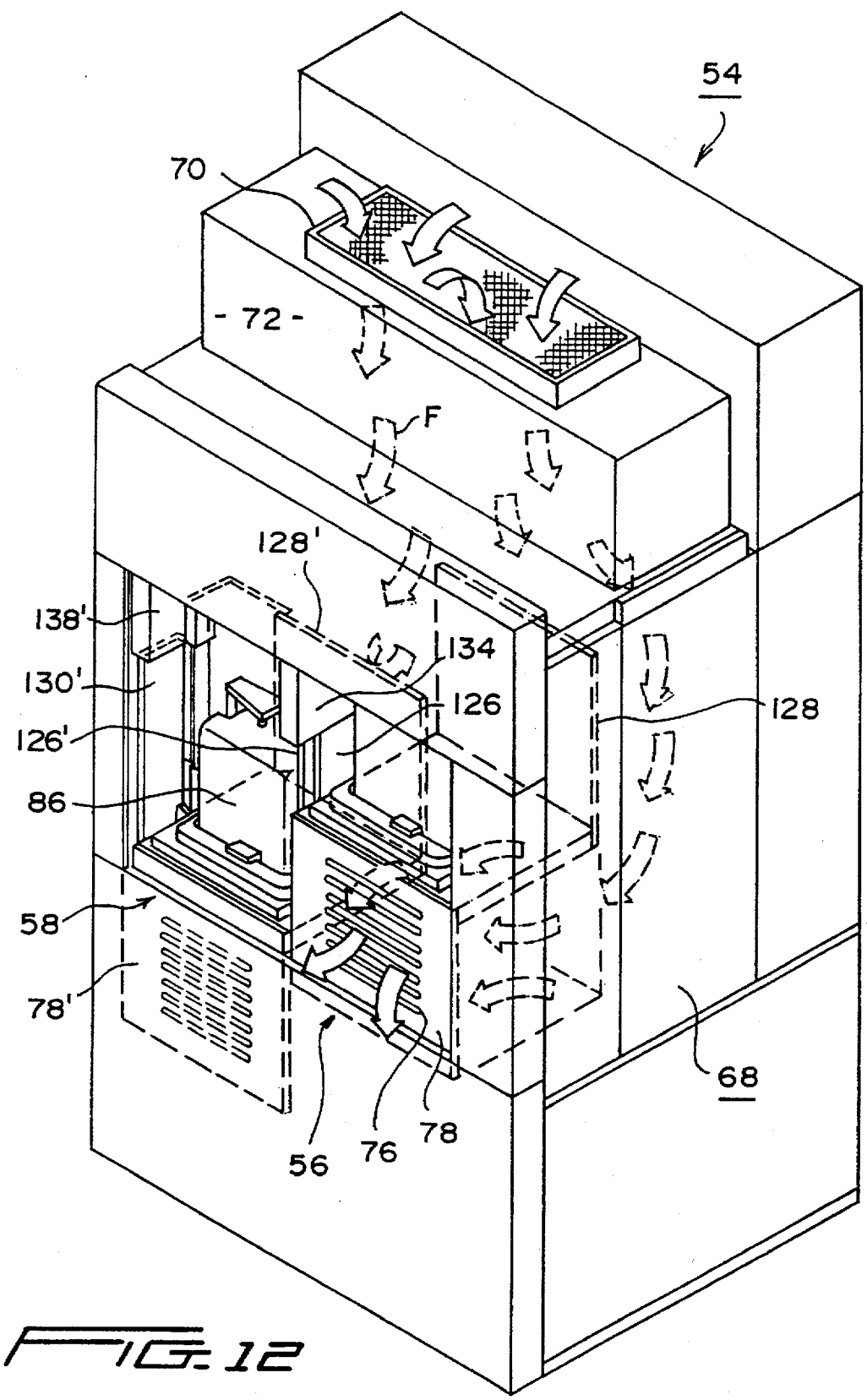

The purpose of front panel louvers 76 is to provide a positive airflow around the uncovered cassette 66 from the rear portal 142 to the louvers 76 as shown in FIG. 12. This positive airflow creates and maintains the mini-environment within the platform area 148 during the raising and lowering of lift plate 96 and while it is in its uppermost position during wafer processing operations. When the lift plate 96 is returned to its lowermost position, transfer station 56 is returned to ambient conditions because of the closure of portal 142 by the rear door 140. The second transfer station 58 is shown in this condition in FIG. 2. Simultaneously, port door 104 closes the opening in port plate 90 and the base 102 of carrier cover 80 is relocked to the carrier door 100, such that the carrier 62 with the reloaded cassette 66 therein may be carried to another processing station.

Figure 7:
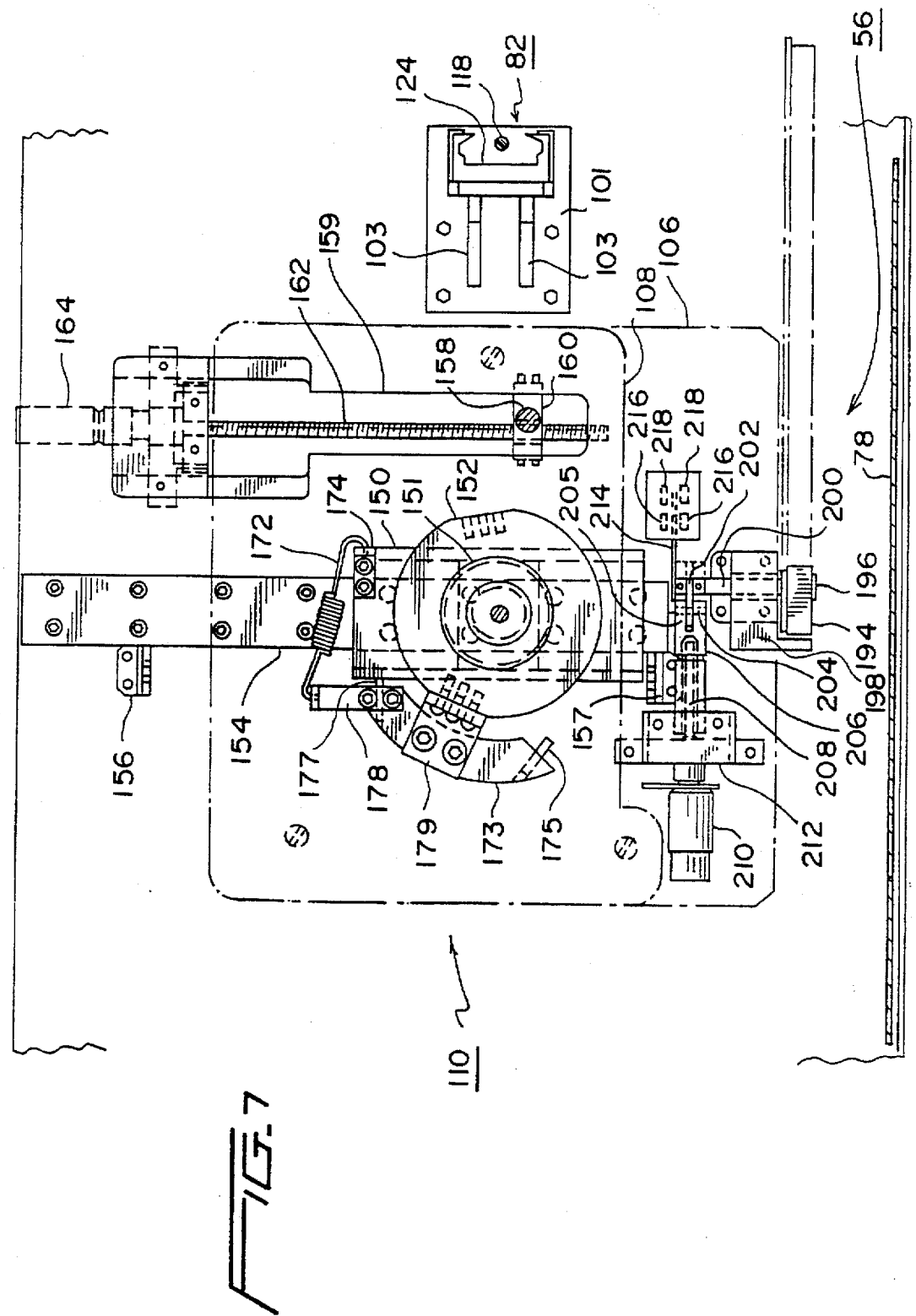
FIG. 7 is a fragmentary top plan view in partial section with platform plates in phantom outline to show details of the mechanisms for moving and rotating the cassette platform.

Horizontal movement of the cassette platform 110 within the cabinet enclosure 68, after the cover 80 has been raised to its overlying position, will now be described. The lower platform plate 108 is mounted for rotation on a movable carriage 150 by means of a bearing assembly 151 within an annular housing 152 (FIG. 7). The carriage 150 is mounted for translational movement on a track 154 having a rear carriage stop 156 and a front carriage stop 157. The upper and lower plates of the cassette platform are moved in response to movement of a vertical rod 158 which depends from lower platform plate 108 and is driven back and forth by a platform traveller member 160 having threads engaged by the threads of a screw 162, which is driven in rotation by a reversible linear drive motor 164.

Figure 8:
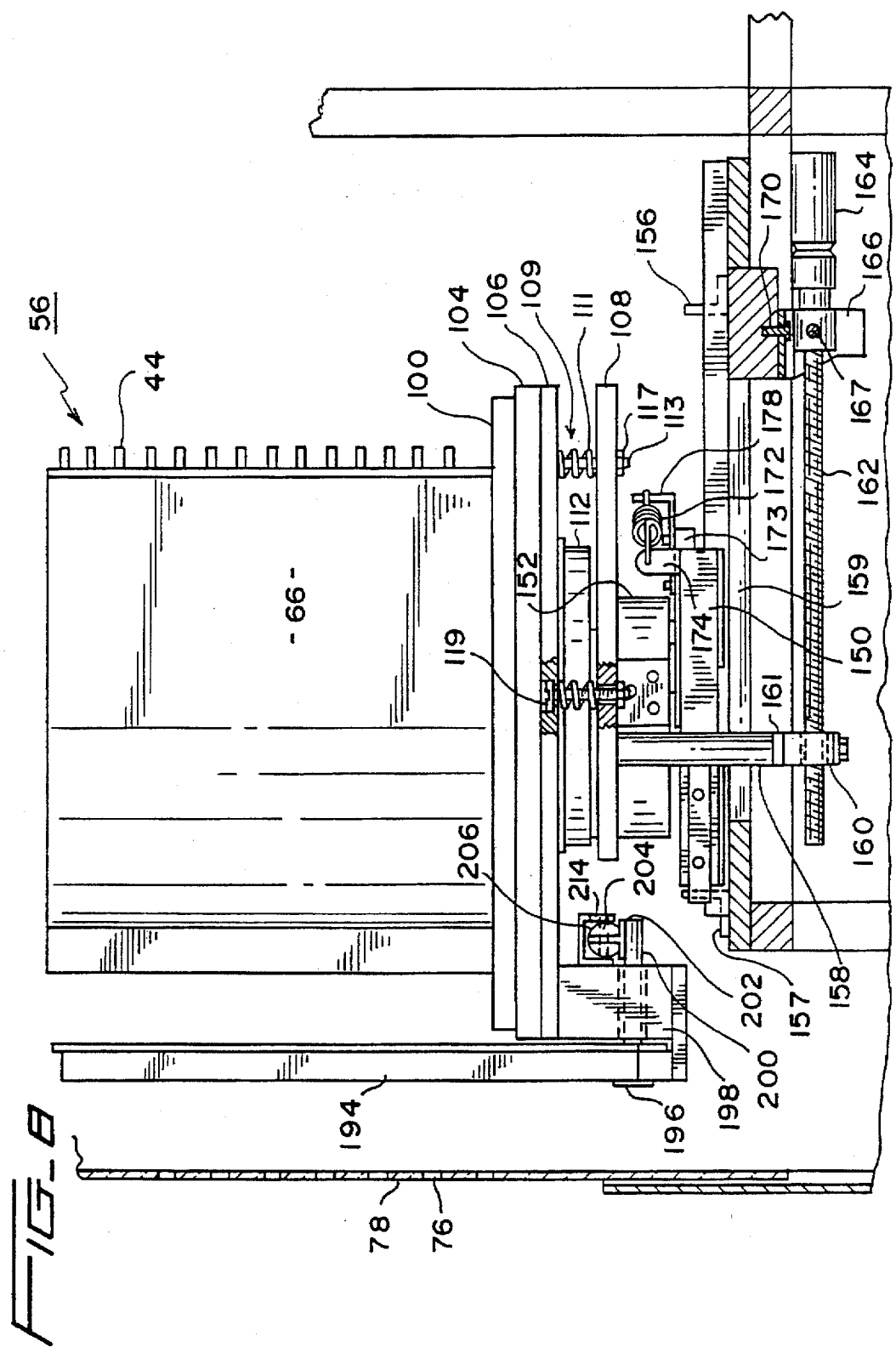
FIG. 8 is a fragmentary side elevational view in partial section to show additional details of the mechanisms of FIG. 7.

Traveller 160 is pivotally mounted on the lower end of rod 158 by a bearing member 161 as may be seen best in FIG. 8. Drive motor 164 is preferably a direct current servomotor, and is pivotally mounted in a bracket 166 for pivotal motion about a pin 167 in a vertical plane. Bracket 166 in turn is mounted on a base plate 168 by a swivel 170 for pivotal movement in a horizontal plane. These pivotal movements provide for the arcuate movement of rod 158 about the rotational axis of bearing assembly 151.

The carriage track 154 is fixedly mounted on the base plate 168, which has an elongated slot 159 for accommodating horizontal movement of rod 158 relative to drive motor 164. Clockwise rotation of the screw 162, as seen from the motor 164, causes the traveller member 160 and the platform assembly 110 to be pulled toward the motor 164 until carriage 150 abuts against rear carriage stop 156, at which point rod 158 causes the upper and lower platform plates, the port door fixed thereto, and any items placed thereon, to rotate counterclockwise relative to the carriage because the rod 158 is attached by the bearing member 161 to the traveller member 160 and the vertical axis of this rod is laterally offset toward the right side from the rotational axis of the bearing assembly 151.

Figure 5:
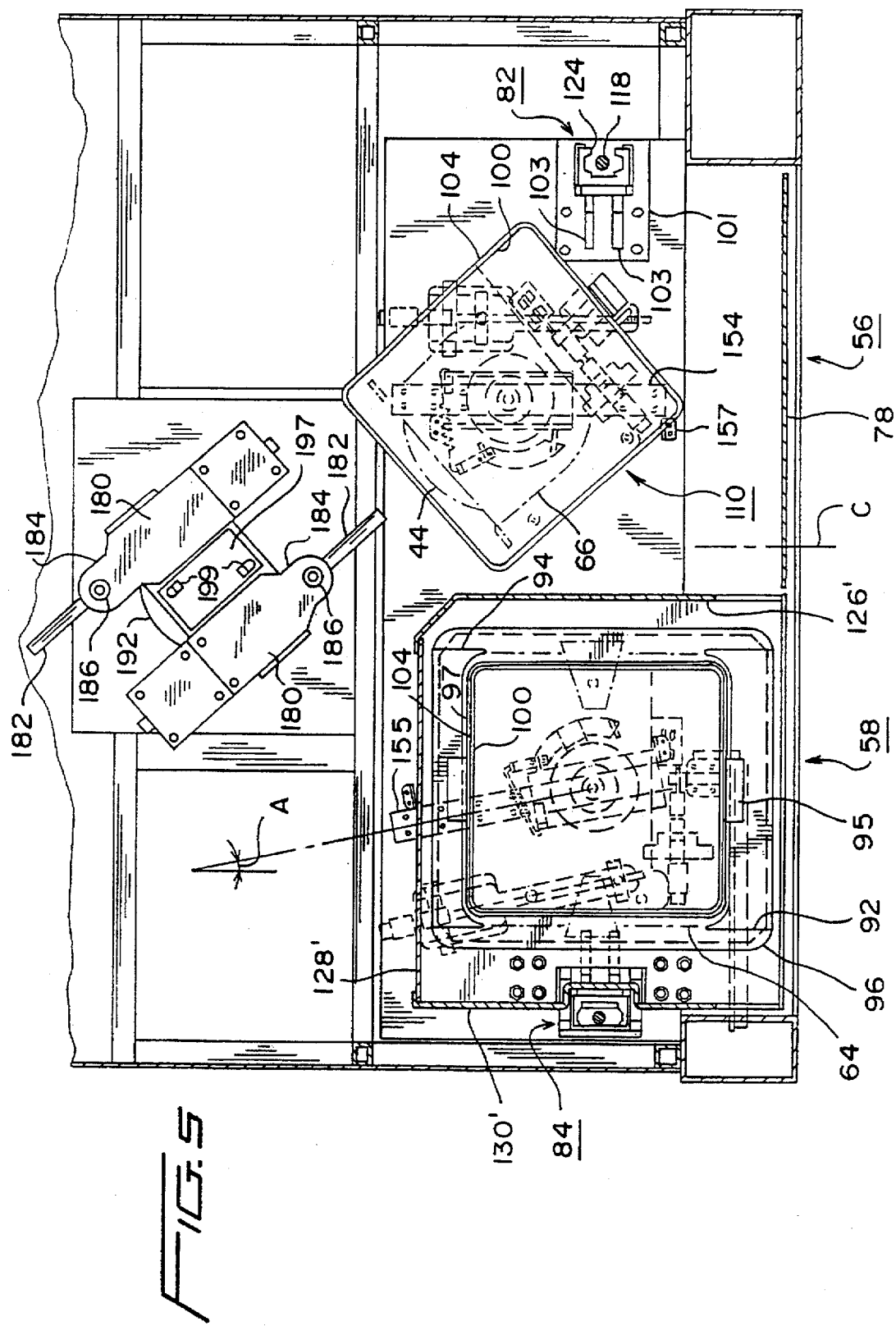
FIG. 5 is a top plan view in section taken along lines 5—5 in FIG. 3, but with one of the cassette platforms in its retracted position and the other cassette platform in its extended position.
Figure 9:
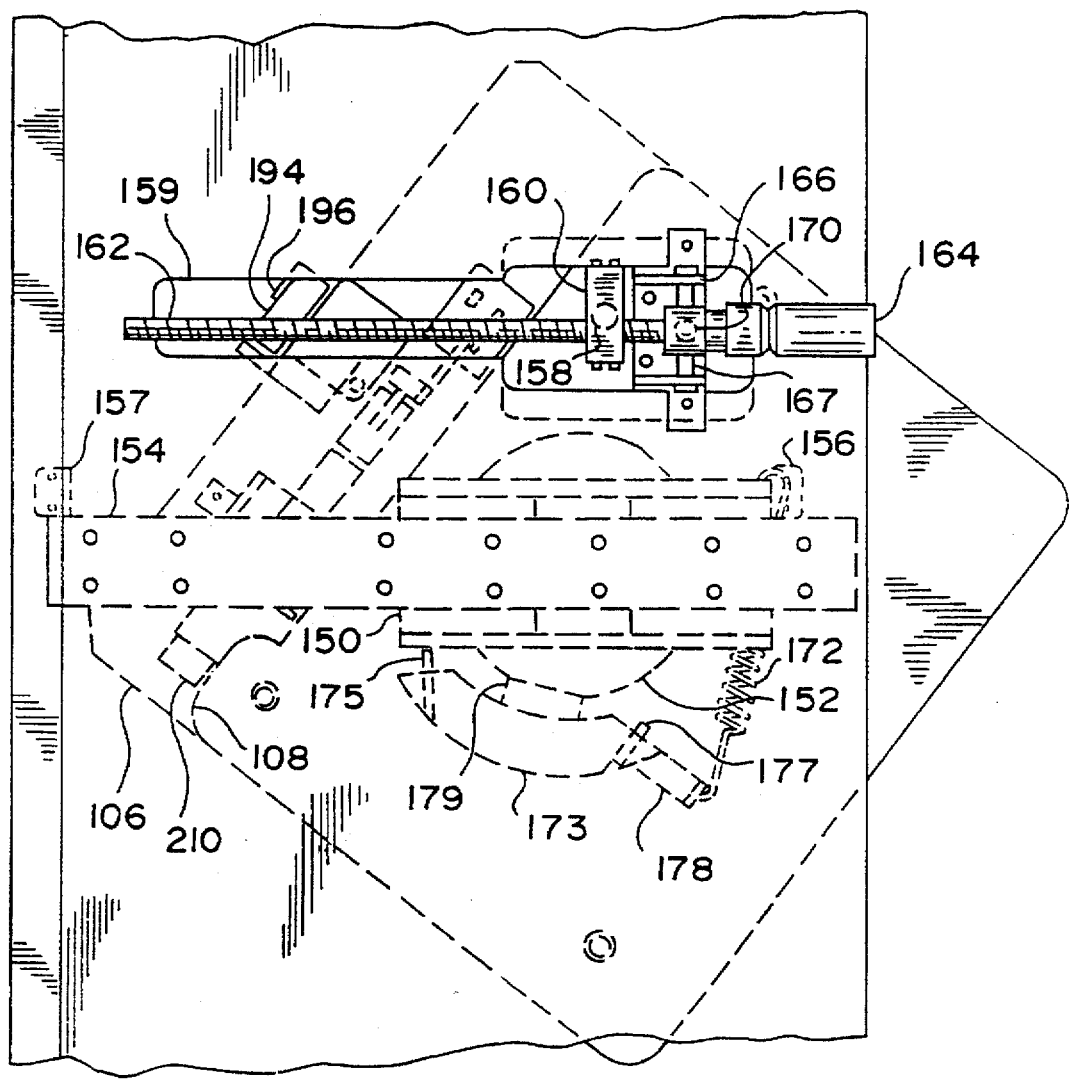
FIG. 9 is a fragmentary bottom plan view showing details of the mechanisms of FIG. 7 from the underside of the cassette platform and the baseplate on which the platform track is mounted.

Counterclockwise rotation of the platform plates is opposed by a coil spring 172, which is connected at one end to an upstanding tab 174 fixed to the carriage 150 and at the other end to an upstanding tab 178 carried by an arcuate bracket 173 fixed to a boss 179, which in turn projects laterally from and is fixed by screws to a flat area on the side of bearing housing 152. Housing 152 is mounted on the underside of and rotates with lower platform plate 108. The platform plates 106 and 108 may rotate against the tension of spring 172 until an adjustable stop 175 on the front end of arcuate bracket 173 abuts against the carriage 150 (FIGS. 5 and 9). When the direction of screw 162 is reversed, traveller member 160 travels away from motor 164. As this return motion commences, plates 106 and 108 rotate clockwise and are returned by spring tension from the rotated position shown in FIGS. 5, 6 and 9 to an in-line position in alignment with track 154 as shown in FIG. 3. This in-line position is determined by abutment between carriage 150 and an adjustable stop 177 on the rear end of arcuate bracket 173. Upon further reverse movement of the rod 158 away from the motor 164, the carriage 150 moves away from the stop 156 until the platform assembly 110 is returned to its initial carrier receiving position as shown in FIG. 7.

When the platform assembly 110 is in the extended position shown in FIGS. 5 and 6, the individual wafers 44 in the cassette 66 are readily accessible by at least one of two identical extensible arm members 180, 180 of robot 144. The arm members 180, 180 are extendable along respective tracks 182, 182 so as to engage individual wafers 44 within the cassette 66. Each arm member 180 has a distal tongue portion 184 with a vacuum orifice 186 for gripping an individual wafer 44 with suction so as to remove the wafer from the cassette 66 and transport it within the processing area 146 so that the desired operations may be performed thereon by the processing apparatus 54.

For the purpose of sequentially engaging and removing successive individual wafers 44 as stacked within cassette 66, the platform 188 on which the arm tracks 182, 182 are mounted is indexed vertically by means of a linear ball screw assembly (not shown) housed within a hollow column 190 that is mounted on a rotatable base member 192. The linear ball screw assembly within column 190 may be of a construction similar to the elevator mechanisms 82 and 84. Conventional pneumatic or hydraulic lifting means may optionally be used for the vertical indexing of the robot arms 180, 180. The important feature here is that the cassette 66 is in a vertically fixed position at all times after placement of the carrier 62 within the transfer station 56. Any vertical jostling of the cassette 66 is thereby avoided. As previously described in connection with FIG. 1, any vertical movement of the wafers stacked within the cassette is undesirable, such as where each successive wafer must pass through the space occupied by the proceeding wafer as it is unloaded and reloaded because the cassette is indexed vertically instead of the robot arm.

For purposes of controlling the indexing of the robot arms 180, 180, there is provided a wafer sensing tower 194 that is pivotable from a horizontal stored position to a vertical sensing position by means of a shaft 196 rotatably mounted in a transmission housing 198 as shown in FIG. 7. Extending from the side of housing 198 opposite to tower 194 is a shaft extension 200 on which is mounted a tongue 202 that extends between and is pivotally attached by a pivot connection 204 to opposing ears 205 of a threaded tube 206, the internal threads of which are engaged by a rotatable screw 208 driven by a direct current reversible servomotor 210.

Rotation of the screw 208 causes linear motion of tube 206. Since the pivot connection 204 is offset laterally from the axis of shaft 196 and its extension 200, linear motion of tube 206 produces rotary motion of the shaft 196 and its extension 200. This rotary motion of the shaft is sufficient to pivot sensing tower 194 between its horizontal rest position alongside lower platform 108 to its upstanding sensing position adjacent to the cassette 66 and the individual wafers 44 stacked therein.

The motor 210 and the screw 208 are mounted for pivotal movement in a vertical plane by means of a rotary bracket 212. Such pivotal movement of the screw 208 is needed to accommodate the vertical motion caused by the lateral offset of pivot connection 204 from the axis of shaft extension 200. Another feature of the linear screw assembly is the rigid mounting of a flag 214 on the rear side of the tube 206 so that linear movement of this tube causes corresponding linear movement of the flag 214, which is thereby caused to pass between respective pairs of sensors 216, 216 and 218, 218. Detection of flag 214 by sensors 216, 216 provides an indication for shutting off motor 210 when sensing tower 194 has reached its upstanding sensing position. Similarly, the sensing of flag 214 by the sensors 218, 218 gives an indication that shuts off motor 210 when the sensor tower 194 has reached its lowered, stored position.

A pair of light emitter 199, 199, such as an LED, are mounted on a center plate 197 between the tracks 182, 182 of robot 144 and each emits a beam of light that may be sensed by light sensing elements 201 positioned at appropriately spaced intervals along sensing tower 194. A microcomputer control system (not shown) may then determine the presence or absence of a wafer at any level within cassette 66 based on whether or not the light beam is blocked by a wafer or detected due to a missing wafer.

The robot 144 also serves to load and unload wafers from the cassette 67 delivered to the transfer station 58 by carrier 64, the components of transfer station 58 being the same as those described above for transfer stations 56. The tracks 154 and 155 of transfer stations 56 and 58, respectively may both be parallel to the centerline C of the cabinet 68. However, a more compact design requiring less lateral space may be achieved by placing track 155 at a small angle "A" (for example, 10°–15°) diverging toward the rear relative to the centerline C, while keeping track 154 parallel to centerline C, as shown in FIG. 6. For the same purpose, the right edge of the rear door 141 of station 56 may be contoured at 230 by a small angular piece 232 to insure free rotation of platform assembly 110 in this compact design. Similar contouring of rear door 140 of station 56 may also be desirable.

While the invention has been described in the form of specific embodiments, many alternatives, modifications, and variations will be apparent to those skilled in the art when they learn of this invention. For example, although the preferred embodiment of the invention has been described in terms of carriers, cassettes, and processing apparatus for semiconductor wafers, the invention is also applicable to carriers, holders and processing apparatus for other types of articles. Accordingly, the preferred embodiment of the invention as set forth herein is intended to be illustrative and not limiting, the scope of the invention being defined only by the claims set forth below.

What is claimed is:

1. A transfer system for transferring articles between two controlled environments, said system comprising:

an article carrier defining a first controlled environment and having a cover and a door for closing an opening in the bottom of said cover;

a holder for supporting at least one article on said carrier door;

an enclosure defining a second controlled environment around an apparatus for processing said article;

a port door for closing a port opening in said enclosure defined by a movable port member, said port door forming at least part of a platform for supporting said carrier door and said article holder within said enclosure, said movable port member being adapted to engage said carrier cover to cause its vertical movement; and, lift means for vertically moving said port member between a down position in which said port door closes said port opening and an up position in which said port member vertically raises said carrier cover to allow access to said article holder by the article processing apparatus.

2. A transfer system according to claim 1, wherein said article processing apparatus is contained in a first compartment of said enclosure and said platform is contained within a second compartment of said enclosure, wherein a portal is provided between said first compartment and said second compartment to allow access to said article holder by an article engaging member of said article processing apparatus, and wherein said transfer system further comprises a portal door connected to said movable port member for vertical movement therewith, said portal door being arranged to close said portal when said port member is in said down position and to open said portal when said port member is in said up position.

3. A transfer system according to claim 2, further comprising air moving means for supplying a flow of filtered air to said enclosure and for exhausting said supplied air from said enclosure, said air moving means being arranged to cause said supplied air to flow through said portal from said first compartment to said second compartment.

4. A transfer system according to claim 3, wherein said air moving means comprises exhaust means for exhausting said supplied air from said enclosure after said supplied air passes through said portal and said second compartment.

5. A transfer system according to claim 1, further comprising transport means for moving said platform within said enclosure relative to the position of said article processing apparatus.

6. A transfer system according to claim 5, wherein said transport means is arranged to move said platform between a retracted position beneath said raised carrier cover and an extended position at which said article may be engaged by a movable engaging member of said article processing apparatus.

7. A transfer system according to claim 6, wherein said transport means comprises translation means for causing horizontal movement of said platform between said retracted and extended positions, and rotation means for causing rotational movement of said platform at said extended position for alignment of said article holder with said article engaging member.

8. A transfer system according to claim 7, wherein said translation means comprises a track, a carriage means for engaging said track for horizontal movement of said platform, and drive means for moving said carriage means along said track.

9. A transfer system according to claim 7, wherein said rotation means comprises bearing means for rotatably mounting said platform on said carriage means, and torque means for causing rotation of said platform relative to said carriage.

10. A transfer system according to claim 1, wherein said lift means comprises a vertically extending guide means, follower means engaging said guide means for vertical movement, and drive means for moving said follower means along said guide means, said follower means being connected to said port member such that movement of said follower along said guide means causes said port member to move between its down and up positions.

11. A transfer system according to claim 1, wherein said article processing apparatus comprises an article engaging means that is indexed vertically relative to said article holder so as to engage one at a time a plurality of articles each of which is held at a different level in said article holder.

12. A transfer system according to claim 11, further comprising transport means for moving said platform within said enclosure relative to the position of said article engaging means.

13. A transfer system according to claim 1, wherein said article is a semiconductor wafer, and said processing apparatus performs at least one operation for providing an integrated circuit on said semiconductor wafer.

14. A transfer system according to claim 13, wherein said article holder is a cassette for supporting a plurality of semiconductor wafers on said carrier door.

15. A method for transferring articles between a first controlled environment and a second controlled environment, said first controlled environment being defined by an article carrier having a cover and a door for closing an opening in the bottom of said cover, and said second controlled environment being defined by an enclosure around an apparatus for processing said article, said method comprising:

placing said carrier on a port door for closing a port opening in said enclosure defined by a movable port member, said port door forming at least part of a platform for supporting said carrier door and an article holder within said enclosure, said movable port member being adapted to engage said carrier cover to cause its vertical movement, and said holder being adapted to support at least one of said articles on the carrier door; and, vertically moving said port member by lift means between a down position in which said port door closes said port opening and an up position in which said port member vertically raises said carrier cover to allow access to said article holder by the article processing apparatus.

16. A method according to claim 15, wherein said article processing apparatus is contained in a first compartment of said enclosure and said platform is contained within a second compartment of said enclosure, wherein a portal is provided between said first compartment and said second compartment to allow access to said article holder by an article engaging member of said article processing apparatus, wherein said transfer system further comprises a portal door connected to said movable port member for vertical movement therewith, and wherein said method further comprises closing said portal with said portal door when said port member is in said down position and opening said portal when said port member is in said up position.

17. A method according to claim 16 further comprising supplying a flow of filtered air to said enclosure, directing said supplied air through said portal from said first compartment to said second compartment, and exhausting said supplied air from said enclosure after said supplied air passes through said portal and said second compartment.

18. A method according to claim 15 further comprising moving said platform horizontally between a retracted position beneath said raised carrier cover and an extended position at which said article may be engaged by a movable engaging member of said article processing apparatus.

19. A method according to claim 18 further comprising rotating said platform at said extended position to align said article holder with the article engaging member of said article processing apparatus.

20. A method according to claim 15, wherein said article processing apparatus comprises an article engaging means that is indexed vertically relative to said article holder, and wherein said method further comprises maintaining said article holder at a fixed vertical height and indexing said article engaging means vertically relative to said article holder so as to engage one at a time a plurality of articles each of which is held at a different level in said article holder.

* * * * *